(12) United States Patent
Kim et al.

(10) Patent No.: US 11,881,277 B2
(45) Date of Patent: Jan. 23, 2024

(54) MEMORY DEVICE AND OPERATING METHOD THEREOF

(71) Applicant: Samsung Electronics Co., Ltd., Suwon-si (KR)

(72) Inventors: Sungrae Kim, Hwaseong-si (KR); Myungkyu Lee, Seoul (KR); Kijun Lee, Seoul (KR); Sunghye Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/718,422

(22) Filed: Apr. 12, 2022

(65) Prior Publication Data

US 2023/0037996 A1 Feb. 9, 2023

(30) Foreign Application Priority Data

Aug. 6, 2021 (KR) .................. 10-2021-0103984

(51) Int. Cl.
*G11C 29/44* (2006.01)
*G11C 15/04* (2006.01)
(Continued)

(52) U.S. Cl.
CPC .......... *G11C 29/44* (2013.01); *G06F 11/1016* (2013.01); *G11C 15/04* (2013.01);
(Continued)

(58) Field of Classification Search
CPC ......... H03M 13/1108; H03M 13/1168; H03M 13/1575; G11C 15/04; G11C 17/165;
(Continued)

(56) References Cited

U.S. PATENT DOCUMENTS 5,020,060 A * 5/1991 Murai .................. H03M 13/00
714/784
5,373,511 A * 12/1994 Veksler .............. H03M 13/151
714/755
(Continued)

OTHER PUBLICATIONS

Evain, Samuel et al., "Error-Correction Schemes with Erasure Information for Fast Memories", 2013, 18th IEEE European Test Symposium (ETS).
(Continued)

*Primary Examiner* — Steve N Nguyen
(74) *Attorney, Agent, or Firm* — Muir Patent Law, PLLC

(57) ABSTRACT

An operating method of a memory device includes storing position information regarding a codeword including an erasure and erasure information including position information regarding the erasure in a memory region, loading the position information regarding the codeword to a row decoder and a column decoder, determining whether a read address corresponding to a read instruction is identical to the position information regarding the codeword including the erasure, in response to the read instruction from a host, transmitting the position information of the erasure to an error correction code (ECC) decoder, when the read address is identical to the position information regarding the codeword including the erasure, and correcting, by the ECC decoder, an error in a codeword received from a memory cell array using the position information regarding the erasure.

19 Claims, 14 Drawing Sheets

(51) Int. Cl.
  *G11C 17/16* (2006.01)
  *H03M 13/11* (2006.01)
  *H03M 13/15* (2006.01)
  *G06F 11/10* (2006.01)

(52) U.S. Cl.
  CPC ....... *G11C 17/165* (2013.01); *H03M 13/1108* (2013.01); *H03M 13/1168* (2013.01); *H03M 13/1575* (2013.01)

(58) Field of Classification Search
  CPC ..... G11C 29/42; G11C 29/44; G06F 11/1012; G06F 11/1048; G06F 9/30029; G06F 11/1016; G06F 11/1044
  See application file for complete search history.

(56) References Cited

U.S. PATENT DOCUMENTS

| | | | | |
|---|---|---|---|---|
| 5,715,262 | A * | 2/1998 | Gupta | H03M 13/151 |
| | | | | 714/784 |
| 6,101,614 | A * | 8/2000 | Gonzales | G06F 11/106 |
| | | | | 710/39 |
| 6,832,042 | B1 * | 12/2004 | Shieh | H04N 9/7921 |
| 6,976,194 | B2 * | 12/2005 | Cypher | G11C 29/42 |
| | | | | 714/767 |
| 7,278,085 | B1 | 10/2007 | Weng et al. | |
| 7,467,337 | B2 * | 12/2008 | Nakamura | G11C 29/42 |
| | | | | 714/704 |
| 8,370,710 | B2 | 2/2013 | Kim et al. | |
| 9,633,740 | B1 | 4/2017 | Alhussien et al. | |
| 9,768,807 | B2 | 9/2017 | Zhang et al. | |
| 9,898,363 | B2 | 2/2018 | Kim et al. | |
| 10,020,822 | B2 | 7/2018 | Zhang et al. | |
| 10,162,703 | B2 | 12/2018 | Kim | |
| 10,230,396 | B1 * | 3/2019 | Micheloni | G06F 11/1048 |
| 10,579,472 | B2 | 3/2020 | Kim | |
| 10,860,419 | B2 | 12/2020 | Somasekhar et al. | |
| 11,323,138 | B1 * | 5/2022 | Shin | H03M 13/45 |
| 2005/0024956 | A1 * | 2/2005 | Tran | G11C 29/50004 |
| | | | | 365/200 |
| 2005/0268203 | A1 | 12/2005 | Keays et al. | |
| 2009/0006899 | A1 | 1/2009 | Gara et al. | |
| 2009/0031197 | A1 * | 1/2009 | Lu | H03M 13/1515 |
| | | | | 714/752 |
| 2009/0183053 | A1 | 7/2009 | Ito et al. | |
| 2010/0157641 | A1 | 6/2010 | Shalvi et al. | |
| 2014/0201597 | A1 * | 7/2014 | Hoekstra | G06F 11/10 |
| | | | | 714/764 |
| 2016/0283325 | A1 | 9/2016 | Kwok | |
| 2017/0017545 | A1 * | 1/2017 | Tanabe | H03M 13/373 |
| 2017/0286217 | A1 * | 10/2017 | Kreifels | H03M 13/618 |
| 2018/0217894 | A1 | 8/2018 | Park et al. | |
| 2018/0314595 | A1 * | 11/2018 | Eichmeyer | G11C 29/42 |
| 2020/0394104 | A1 | 12/2020 | Brooks | |
| 2021/0126657 | A1 * | 4/2021 | Tanakamaru | H03M 13/353 |

OTHER PUBLICATIONS

Search Report for corresponding application No. EP 22181312.4 dated Feb. 6, 2023.

Tervo, "ECE4253 Hamming Code—A Matrix Approach", Retrieved from the Internet: URL: https://www.ece.unb.ca/tervo/ee4253/hamming2.shtml [retrieved on Nov. 29, 2022].

* cited by examiner

| K0 | K1 | K2 | K3 | P0 | P1 | P2 | P3 |
|----|----|----|----|----|----|----|----|
| 1  | 1  | 1  | 0  | 1  | 0  | 0  | 0  |
| 1  | 1  | 0  | 1  | 0  | 1  | 0  | 0  |
| 1  | 0  | 1  | 1  | 0  | 0  | 1  | 0  |
| 0  | 1  | 1  | 1  | 0  | 0  | 0  | 1  |

$P0 = K0 \oplus K1 \oplus K2$
$P1 = K0 \oplus K1 \oplus K3$
$P2 = K0 \oplus K2 \oplus K3$
$P3 = K1 \oplus K2 \oplus K3$

| RA | CA | HD | HI |
|---|---|---|---|
| RA[0] | CA[0] | HD[0] | HI[0] |
| RA[1] | CA[1] | HD[1] | HI[1] |
| ⋮ | ⋮ | ⋮ | ⋮ |
| RA[n-1] | CA[n-1] | HD[n-1] | HI[n-1] |

FIG. 6

MEMORY DEVICE AND OPERATING METHOD THEREOF

CROSS-REFERENCE TO RELATED APPLICATION(S)

This application claims priority to Korean Patent Application No. 10-2021-0103984 filed on Aug. 6, 2021 in the Korean Intellectual Property Office, the disclosure of which is incorporated herein by reference in its entirety.

BACKGROUND

The present inventive concept relates to a memory device and an operating method thereof.

High integration or miniaturization of memory devices may increase a probability of an occurrence of an error in which data different from data to be read may be read or data different from data to be programmed may be programmed. A method of improving error correction capability with limited system resources would be desirable.

SUMMARY

An aspect of the present inventive concept is to provide a memory device storing erasure information in a memory and correcting a 2-bit error with a single-bit error correction and double-bit error detection (SEC-DED) using the erasure information.

According to an aspect of the present inventive concept, an operating method of a memory device includes storing position information regarding a codeword including an erasure and erasure information including position information regarding the erasure in a memory region, loading the position information regarding the codeword to a row decoder and a column decoder, determining whether a read address corresponding to a read instruction is identical to the position information regarding the codeword including the erasure, in response to the read instruction from a host, transmitting the position information of the erasure to an error correction code (ECC) decoder, when the read address is identical to the position information regarding the codeword including the erasure, and correcting, by the ECC decoder, an error in a codeword received from a memory cell array using the position information regarding the erasure.

According to an aspect of the present inventive concept, an operating method of a memory device includes receiving a codeword from a memory cell array and calculating a syndrome of the received codeword, calculating a modified syndrome using the syndrome and column data of an erasure, determining a weight of the syndrome, and correcting an error of the received codeword using the modified syndrome and a column index of the erasure when the weight of the syndrome is an even number, wherein the column data of the erasure is a component of an H-matrix corresponding to a position of the erasure in the received codeword, and the column index of the erasure indicates a bit position corresponding to the erasure in the received codeword.

According to an aspect of the present inventive concept, an operating method of a memory device includes receiving a codeword from a memory cell array and calculating a syndrome of the received codeword, calculating a modified syndrome using the syndrome and column data of an erasure, determining a weight of the syndrome, and correcting an error of the received codeword using the syndrome, the modified syndrome, and the weight of the syndrome, wherein the column data of the erasure is a component of an H-matrix corresponding to a position of the erasure in the received codeword.

According to an aspect of the present inventive concept, a memory device includes a syndrome calculator configured to receive a codeword from a memory cell array and calculate a syndrome of the received codeword, a bit calculating unit configured to calculate a modified syndrome using the syndrome and column data of an erasure, a decoder configured to generate an error vector by estimating a position of an error in the received codeword using the syndrome and the modified syndrome, and a data converting unit configured to correct the error of the received codeword using the received codeword and the error vector. The column data of the erasure is a component of a column of an H-matrix corresponding to a position of the erasure in the received codeword.

BRIEF DESCRIPTION OF DRAWINGS

The above and other aspects, features, and advantages of the present inventive concept will be more clearly understood from the following detailed description, taken in conjunction with the accompanying drawings, in which:

FIGS. 5 to 7 are views illustrating a method of operating erasure information according to an embodiment of the present inventive concept;

DETAILED DESCRIPTION

Hereinafter, example embodiments of the present inventive concept are described with reference to the accompanying drawings.

Figure 1:
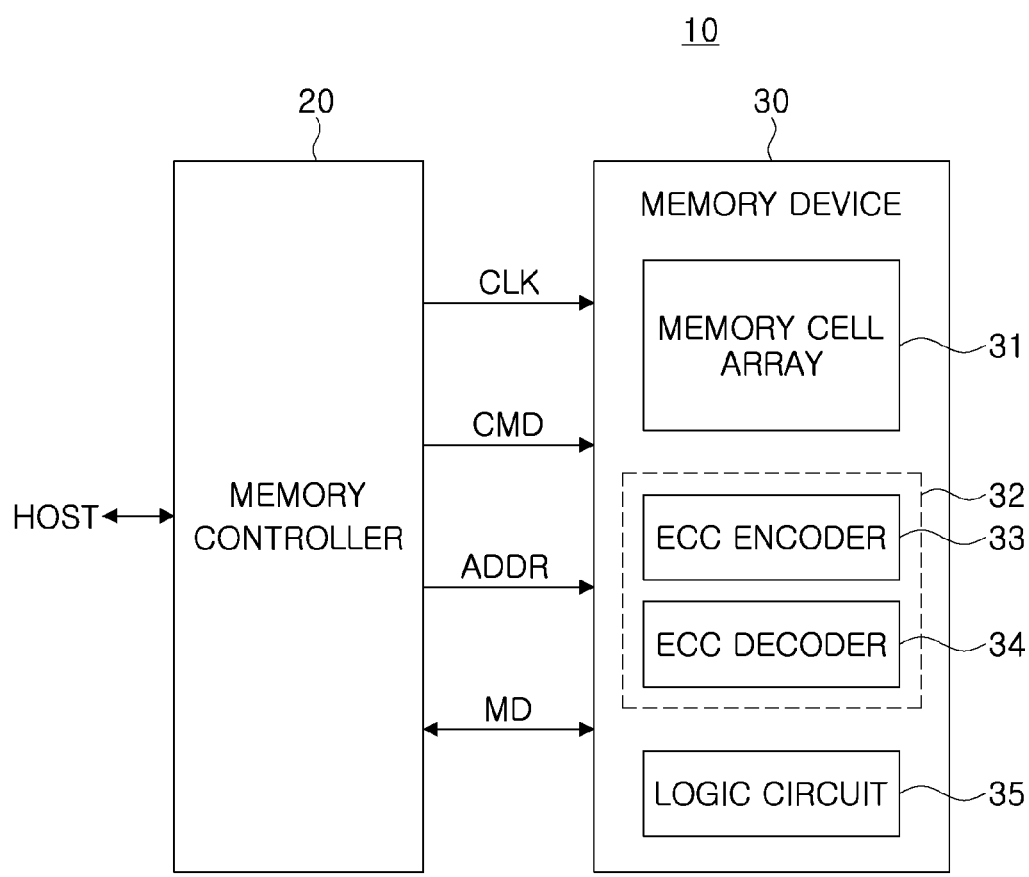
FIG. 1 is a diagram schematically illustrating a memory device according to an embodiment of the present inventive concept.

FIG. 1 is a view schematically illustrating a memory device according to an embodiment of the present inventive concept.

Referring to FIG. 1, a memory system 10 may include a memory controller 20 and a memory device 30.

The memory controller 20 may control an overall operation of the memory system 10 and may control overall data exchange between an external host and the memory device 30. For example, the memory controller 20 may control the memory device 30 according to a program request from the host to program data received from the host into a memory cell array 31. Also, the memory controller 20 may control the memory device 30 according to a read request from the host to transmit data received from the memory cell array 31 to the host.

According to an embodiment, the memory device 30 may be a dynamic random access (DRAM), double data rate 4 (DDR4) synchronous DRAM (SDRAM), or DDR5 SDRAM including volatile memory cells. The memory controller 20 may transmit a clock signal CLK, a command CMD, and an address ADDR to the memory device 30, control an operation of the memory device 30, and exchange main data MD with the memory device 30.

The memory device 30 may include the memory cell array 31, an error correction code (ECC) engine 32, and a logic circuit 35. A codeword including the main data MD and parity data may be stored in the memory cell array 31.

The ECC engine 32 may include an ECC encoder 33 and an ECC decoder 34. The ECC engine 32 may perform ECC encoding on data to be stored in a target memory cell row (target page) of the memory cell array 31 and perform ECC decoding on data read from a target page under the control of the logic circuit 35.

Specifically, in response to a program command from the host, the ECC encoder 33 may generate parity data using the main data MD and an H-matrix and generate a codeword including the main data MD and the parity data. The codeword may be programmed into the memory cell array 31.

In response to a read command from the host, the ECC decoder 34 may receive a codeword from the memory cell array 31 and perform error detection and error correction processing on the received codeword using the H-matrix. The memory device 30 may transmit corrected data to the host.

Single-bit error correction (SEC) refers to correcting a single-bit error that occurs in a codeword, and multi-bit error correction (double-bit error correction (DEC)) refers to correcting a multi-bit error occurring in a codeword. DEC may increase costs such as parity and latency significantly compared to SEC.

Single-bit error correction and double-bit error detection (SEC-DED)) refers to correcting a single bit error occurring in a codeword and detecting the multi-bit error occurring in a codeword. The SEC-DED may be implemented by adding 1-bit of parity data in the SEC. Thus, the SEC-DED may be implemented at a cost lower than the SEC.

The types of errors include an erasure in which a position of data in which an error occurs is known and a random error in which a position of data in which an error occurs is not known. For example, in the case of DRAM, an error occurs continuously or intermittently in the same position in many cases, and such an error may be regarded as an erasure. Therefore, if the position of a bad cell determined in a memory defect test or defect screen process is used, 2-bit error correction may be performed only with the SEC-DED.

According to an embodiment of the present inventive concept, erasure information may be recorded in a memory, and a 2-bit error may be corrected by SEC-DED using the erasure information. Accordingly, it is possible to provide an error correction method that is easy to implement at low cost.

Figures 2, 3:
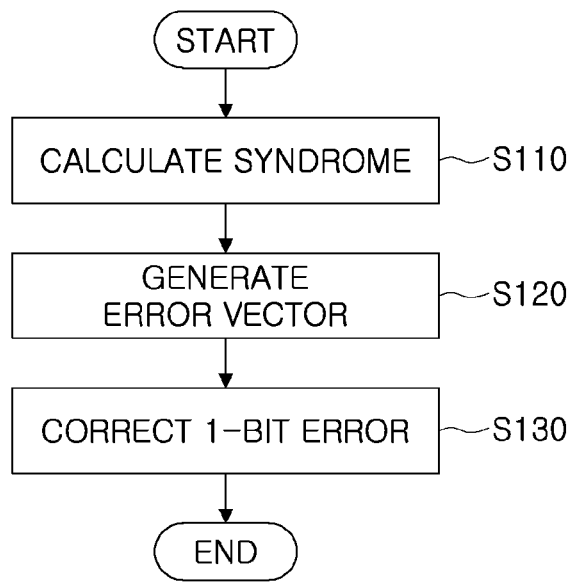
FIG. 2 is a view illustrating a method of operating an error correction code (ECC) encoder according to an embodiment of the present inventive concept.
FIGS. 3 and 4 are comparative examples illustrating an operating method of an ECC decoder according to an embodiment of the present inventive concept.

FIG. 2 is a view illustrating an operating method of an ECC encoder according to an embodiment of the present inventive concept.

Referring to FIG. 2, an H-matrix is stored in the ECC encoder. The H-matrix may include a region K0 to K3 corresponding to main data and a region P0 to P3 corresponding to parity data. For convenience, the region corresponding to the parity data may be an identity matrix. The identity matrix may refer to a square matrix in which all components of a main diagonal are "1" and other remaining components are '0'. Columns of the H-matrix may have different combinations of components.

In response to a program command from the host, the ECC encoder may receive main data MD transmitted from the host. The ECC encoder may generate parity data using the main data MD and the H-matrix.

The parity data may be obtained by performing an exclusive OR (XOR) operation on bits of the main data corresponding to a position having the component of "1" in the region corresponding to the main data of the H-matrix. For example, a first parity bit P0 may be obtained by performing an XOR operation on a bit corresponding to the position of K0, a bit corresponding to the position of K1, and a bit corresponding to the position of K2, among the bits of the main data, a second parity bit P1 may be obtained by performing an XOR operation on the bit corresponding to the position of K0, the bit corresponding to the position of K1, and a bit corresponding to the position of K3, among the bits of the main data, a third parity bit P2 may be obtained by performing an XOR operation on the bit corresponding to the position of K0, the bit corresponding to the position of K2, and the bit corresponding to the position of K3, among the bits of the main data, and a fourth parity bit P3 may be obtained by performing an XOR operation on the bit corresponding to the position of K1, the bit corresponding to the position of K2, and the bit corresponding to the position of K3, among the bits of the main data.

The ECC encoder may generate a codeword including the main data and the parity data. The codeword may be programmed into the memory cell array 31.

Figure 4:
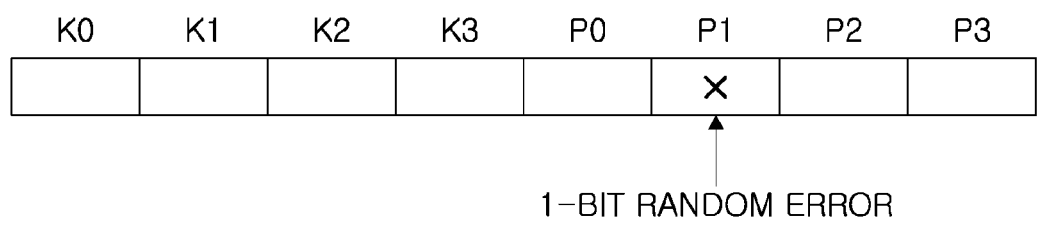

FIGS. 3 and 4 are comparative examples illustrating an operating method of an ECC decoder according to an embodiment of the present inventive concept.

The ECC decoder stores the same H-matrix as the H-matrix stored in the ECC encoder. In response to a read command from the host, the ECC decoder may receive a codeword from a memory cell array.

Referring to FIGS. 3 and 4 together, the ECC decoder may calculate a syndrome S (S110). The syndrome S may be calculated by multiplying the H-matrix H by the received codeword y. As a result of the calculation, if the syndrome S is '0000', it may mean that an error does not occur in the received codeword y. If the syndrome S is not '0000', it may mean that an error has occurred in the received codeword y.

The ECC decoder may generate an error vector v using the calculated syndrome S (S120). The error vector v may refer to a vector in which a position of a bit in which an error occurs in the received codeword is estimated. The ECC decoder may determine a position of a bit having a high probability of error in the received codeword through the error vector v.

A method of generating the error vector v is as follows. First, the ECC decoder may compare the syndrome S with each component of the columns of the H-matrix and determine a position of a column of the H-matrix having the same component as the syndrome S. The ECC decoder may estimate, among bits of the received codeword, a bit corresponding to a position of a column of an H-matrix having a component matching the syndrome S, as a bit having a high possibility of error.

For example, if the calculated syndrome S is '0100', a position of the column of the H-matrix having the same component as the syndrome S in the H-matrix of FIG. 2 may be a sixth column. Therefore, a sixth bit, among the bits of the received codeword, may be estimated to have a high possibility of error, and thus, the ECC decoder may generate an error vector as "00000100."

The ECC decoder may correct a 1-bit error in the received codeword using the error vector v (S130). The ECC decoder may perform an XOR operation on the received codeword y and the error vector v to correct the 1-bit error in the received codeword, and output an error-corrected codeword x.

Each column of the H-matrix may be an odd weight column in which an odd number of 1's exist in the component. When the 1-bit error occurs in the received codeword, an odd number of 1's exists in the syndrome S, and thus, a syndrome weight may be an odd number. However, when a 2-bit error occurs in the received codeword, an even number of 1's exists in the syndrome S, and thus, the syndrome weight may be an even number. When the syndrome weight is an even number, there is no column in the H-matrix having a component that matches the syndrome S. Therefore, it is possible to detect only a 2-bit error from the even number of syndrome weight and the error in the received codeword may not be corrected.

According to an embodiment of the present inventive concept, erasure information may be recorded in a memory, and the 2-bit error may be corrected by SEC-DED using the erasure information and the syndrome weight. Accordingly, it is possible to provide an error correction method that is easy to implement at low cost.

Figure 5:
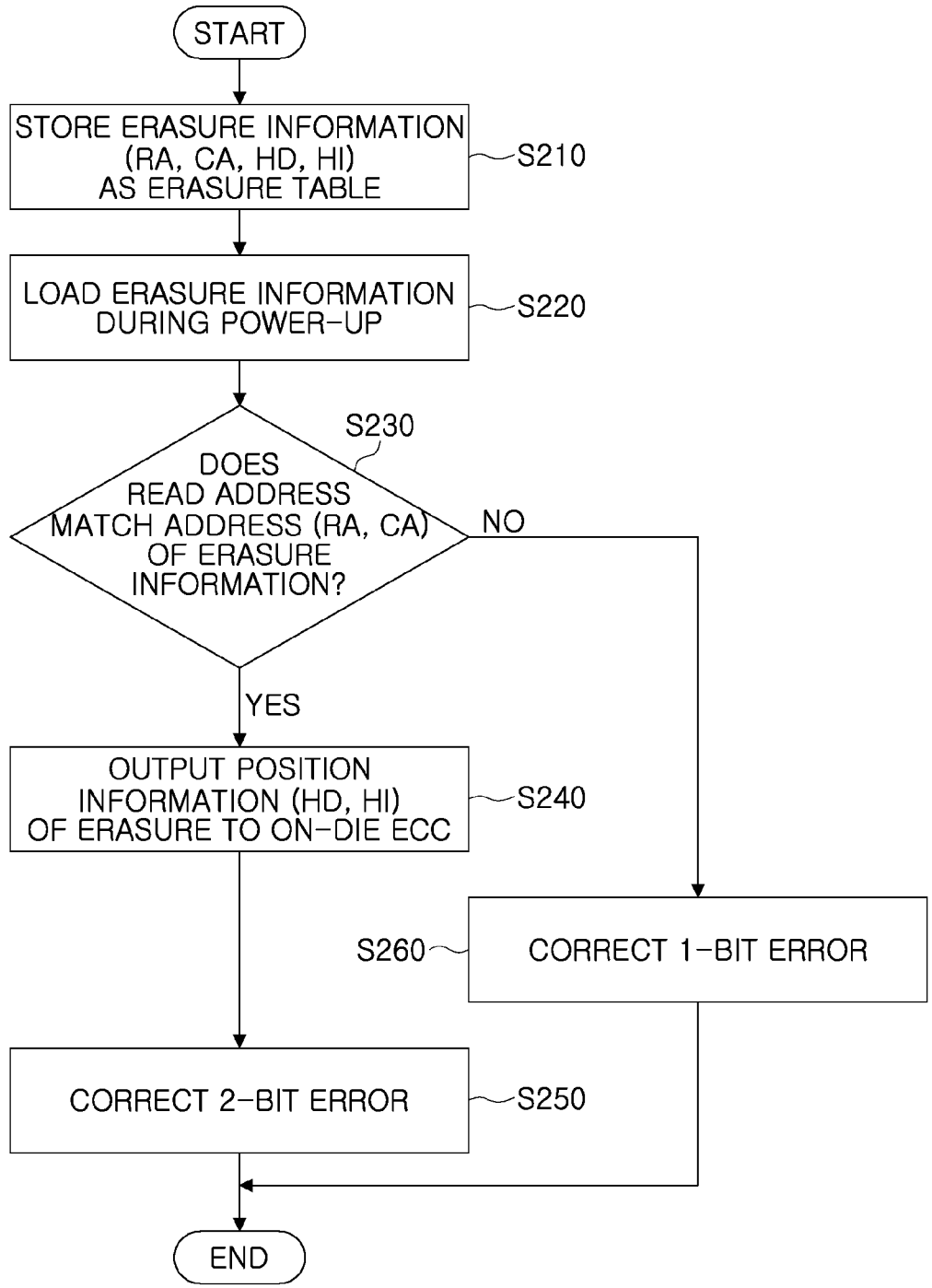
Figure 7:
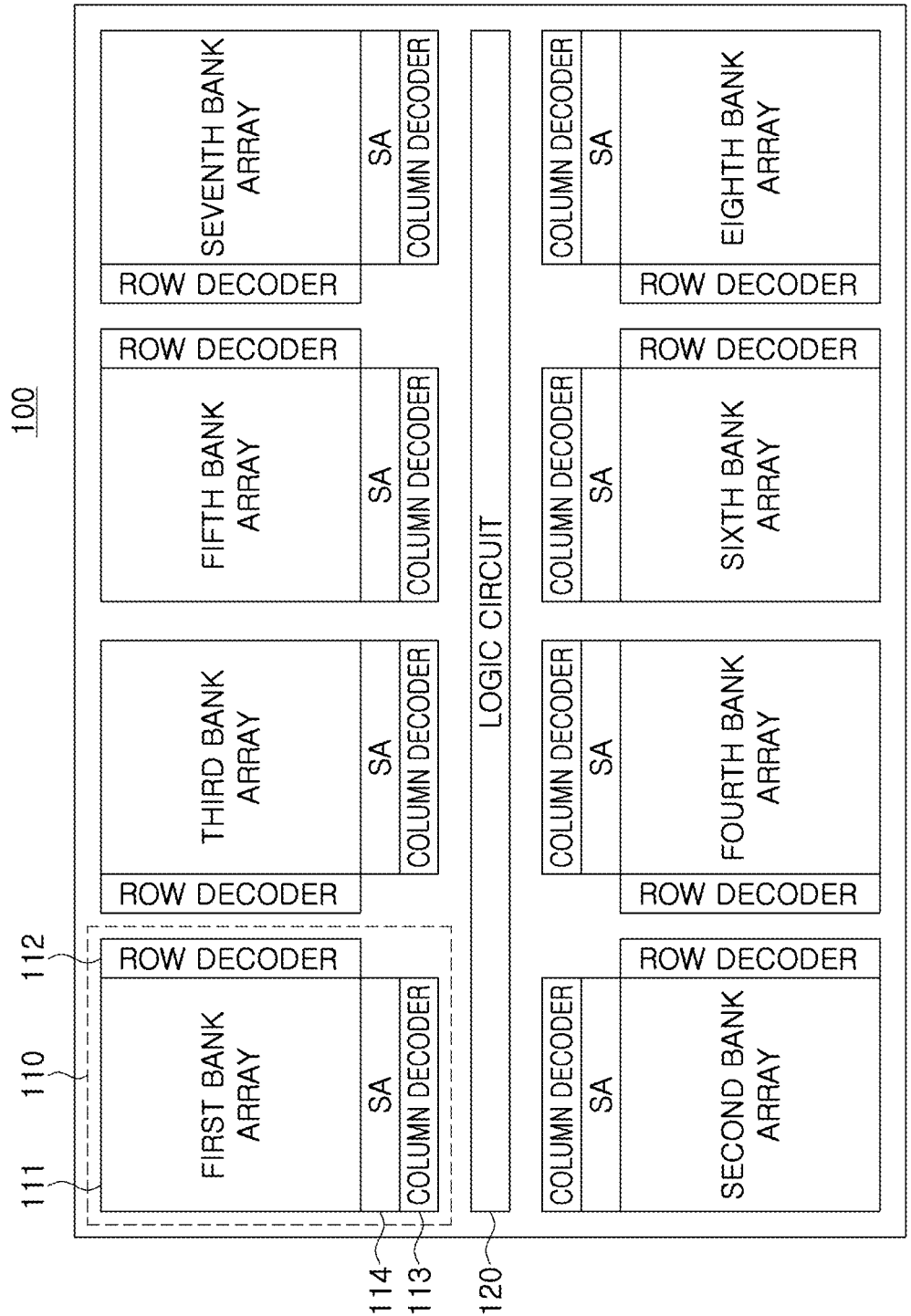

FIGS. 5 to 7 are views illustrating a method of operating erasure information according to an embodiment of the present inventive concept.

Referring to FIGS. 5 and 6, the memory device may store erasure information in the form of a table in the memory region (S210). The erasure information may include a row address RA (RA[0] to RA[n-1], a column address CA (CA[0] to CA[n-1]), and column data HD (HD[0] to HD[n-1]). The row address RA and the column address CA may indicate positions of a codeword including an erasure in the memory cell array. The column data HD of the erasure may refer to a component of a column of the H-matrix corresponding to a position of the erasure in the codeword. For example, referring to the H-matrix of FIG. 2, if the position of the erasure is a 6th bit in the codeword, the column data HD of the erasure may be '0100', a component of the 6th column in the H-matrix.

According to an embodiment, the erasure information may further include the column index HI (HI[0] to HI[n-1]) of the erasure. The column index HI of the erasure may refer to a position of the column of the H-matrix corresponding to the position of the erasure in the codeword. In the above embodiment, if the position of the erasure is a 6th bit in the codeword, the column index HI of the erasure may be '00000100'.

According to an embodiment of the present inventive concept, the erasure information may include position information RA and CA of the codeword including the erasure and position information HD and HI of the erasure. The memory device may store the erasure information RA, CA, HD, and HI in the memory region and correct a 1-bit erasure and a 1-bit random error with the SEC-DED using the erasure information RA, CA, HD, and HI and a syndrome weight.

In addition, when erasure information includes the row address RA, the column address CA, and the column data HD of the erasure, it is not necessary to store the erasure column index HI in the memory region, and thus, system resources may be used efficiently.

Referring to FIG. 7, the memory device 100 according to an embodiment of the present inventive concept may include a memory bank 110 and a logic circuit 120. The memory bank 110 may include a bank array 111 having a plurality of memory cells, a row decoder 112, a column decoder 113, and a sense amplifier 114. In an embodiment, the memory device 100 may include a plurality of memory banks 110.

A plurality of memory banks 110 included in the memory device 100 may share one logic circuit 120. The logic circuit 120 may read data from the bank array 111, store data in the bank array 111, or delete data stored in the bank array 111. In addition, the logic circuit 120 may include a receiver and a transmitter connected to input/output pins for transmitting and receiving data and a control logic for controlling the row decoder 112, the column decoder 113, the sense amplifier 114, etc.

The memory region for storing erasure information in the memory device 100 may include at least one of an anti-fuse array and a content-addressable memory (CAM), but is not limited thereto. The ECC decoder may be included in the column decoder 113, and the anti-fuse array may be included in the logic circuit 120.

Referring to FIGS. 5 and 7 together, when the memory device is powered up, the erasure information RA, CA, HD, and HI may be loaded into memory regions of the row decoder 112 and the column decoder 113 (S220). For example, during power-up, the row address RA may be loaded into an SRAM of the row decoder 112, the column address CA may be loaded into an SRAM of the column decoder 113, and the column data HD of the erasure and the column index HI of the erasure may be loaded into an SRAM connected to an ECC engine of the column decoder 113.

In response to a read command from the host, the ECC decoder may receive a codeword from the memory cell array. The memory device may determine whether a read address corresponding to the read command and the position information RA and CA of the codeword including the erasure match each other (S230) (e.g., if they are identical). For example, the row decoder 112 may determine whether the row address of the read address matches the row address RA of the erasure information, and the column decoder 113 may determine whether the column address of the read address matches the column address CA of the erasure information.

If the read address and the addresses RA and CA of the erasure information match (YES in S230), the ECC decoder may determine that the erasure exists in the received codeword. The column data HD of the erasure and the column index HI of the erasure stored in the SRAM may be output to the ECC decoder (S250).

The ECC decoder may correct a 2-bit error in the received codeword using the position information regarding the erasure, i.e., the column data HD of the erasure and/or the column index HI of the erasure (S260). The 2-bit error may include a 1-bit erasure and a 1-bit random error.

If the read address and the address of the erasure table do not match (NO in S230), the ECC decoder may determine that the erasure does not exist in the received codeword. The ECC decoder may correct a 1-bit random error in the received codeword.

A method of correcting an error by the ECC decoder in a received codeword is described with reference to FIGS. 8 to 17.

Figure 8:
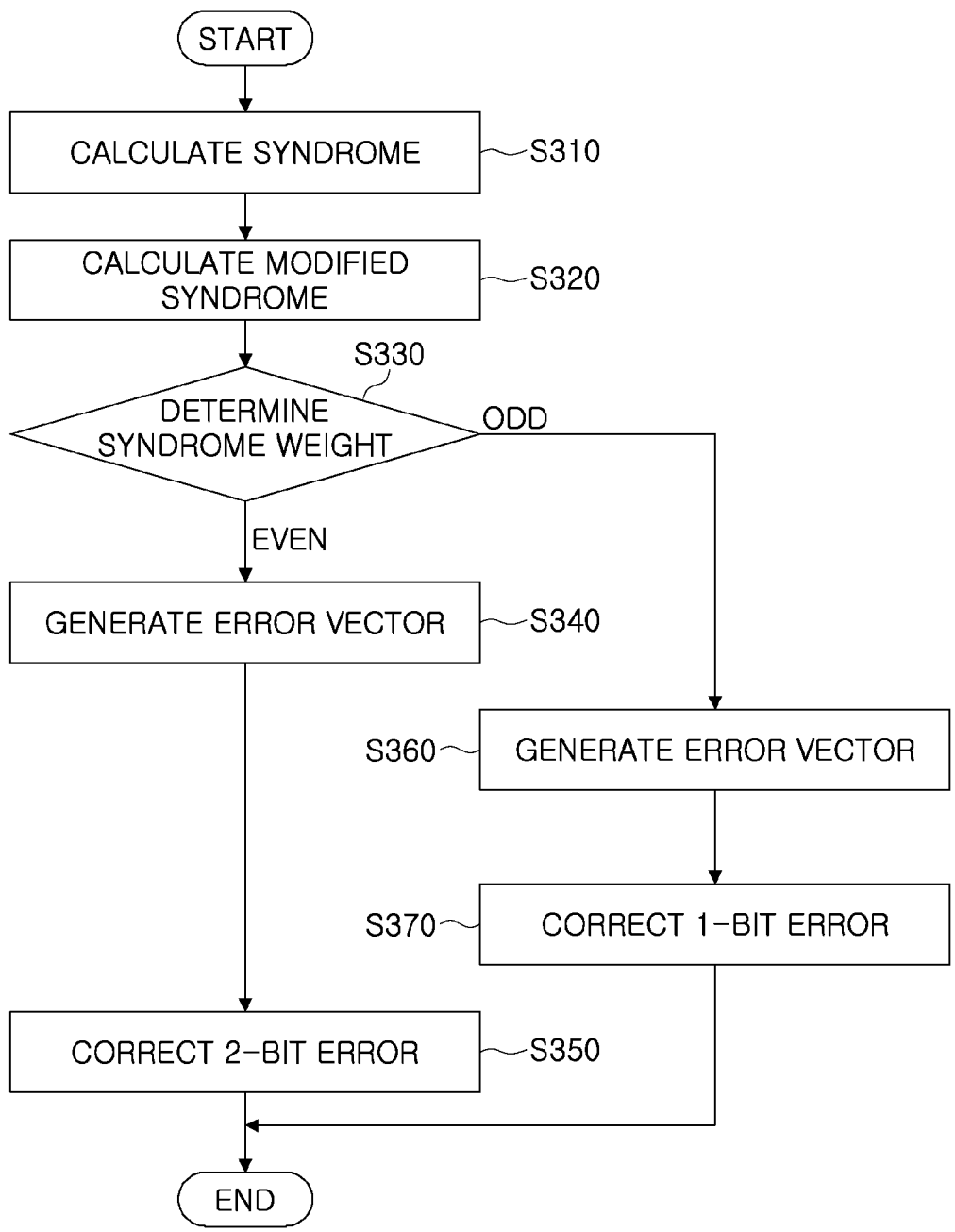
FIGS. 8 and 9 are diagrams illustrating an operating method of an ECC decoder according to an embodiment of the present inventive concept.
Figure 9:
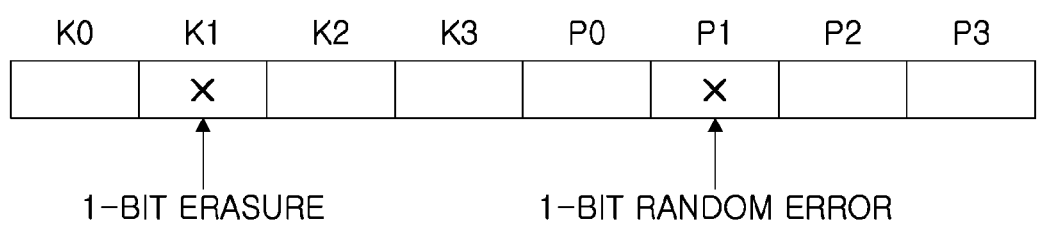

FIGS. 8 and 9 are diagrams illustrating an operating method of an ECC decoder according to an embodiment of the present inventive concept.

Referring to FIGS. 8 and 9 together, the ECC decoder may receive a codeword from the memory cell array and calculate a syndrome of the received codeword (S310). The syndrome S may be calculated by multiplying the H-matrix H by the received codeword y.

The ECC decoder may calculate a modified syndrome using the syndrome S and the column data HD of the erasure (S320). The modified syndrome MS may be calculated by performing an XOR operation on the syndrome S and the erasure column data HD. For example, if the syndrome S is '1001' and the column data HD of the erasure is '0100', the modified syndrome may be '1101'.

The ECC decoder may determine a syndrome weight (S330). If an odd number of 1's exists in the syndrome, the syndrome weight may be an odd number ODD, and if an even number of 1's exists in the syndrome, the syndrome weight may be an even number EVEN.

If the syndrome weight is an even number (EVEN in S320), the ECC decoder may generate an error vector using the column index HI of the erasure and/or the column data HD of the erasure, and the modified syndrome MS (S340).

If the syndrome weight is an even number, it may mean that a 2-bit error exists in the received codeword. The column index HI of the erasure indicates the position of the column of the H-matrix corresponding to the position of the erasure in the codeword, and thus, the ECC decoder may estimate the position of the erasure from the column index HI of the erasure. In addition, the ECC decoder may know a position of a random error from the modified syndrome MS.

For example, referring to the H-matrix of FIG. 2, the ECC decoder may estimate the position of the erasure in the received codeword using the column index HI of the erasure.

According to an embodiment, the ECC decoder may estimate the position of the erasure in the received codeword using the column data HD of the erasure. For example, since the column data (e.g., '0100') of the erasure matches the component of the 6th column in the H-matrix, the position of the erasure may be estimated to be a 6th bit in the received codeword.

The ECC decoder may estimate a random error position in the received codeword using the modified syndrome. For example, since the modified syndrome (e.g., '1101') matches the component of the second column in the H-matrix, the position of the random error may be estimated to be a second bit in the received codeword. Accordingly, the ECC decoder may generate an error vector as '01000100'.

The ECC decoder may correct the 1-bit erasure and the 1-bit random error using the error vector v (S350). Therefore, the 2-bit error may be corrected. The ECC decoder may correct an error of the received codeword by performing an XOR operation on the received codeword y and the error vector v, and may output an error-corrected codeword x.

As a result of determining the syndrome weight, if the syndrome weight is an odd number (ODD in S320), the ECC decoder may determine that a 1-bit error exists in the received codeword, and estimate a random error position in the received codeword using the syndrome (S360). The ECC decoder may correct a 1-bit random error using the error vector (S370).

FIGS. 10 to 13 are diagrams illustrating a first embodiment in which erasure information includes a row address, a column address, column data of an erasure, and a column index of the erasure, and FIGS. 14 to 17 are views illustrating a second embodiment in which erasure information includes a row address, a column address, and column data of an erasure.

Figure 10:
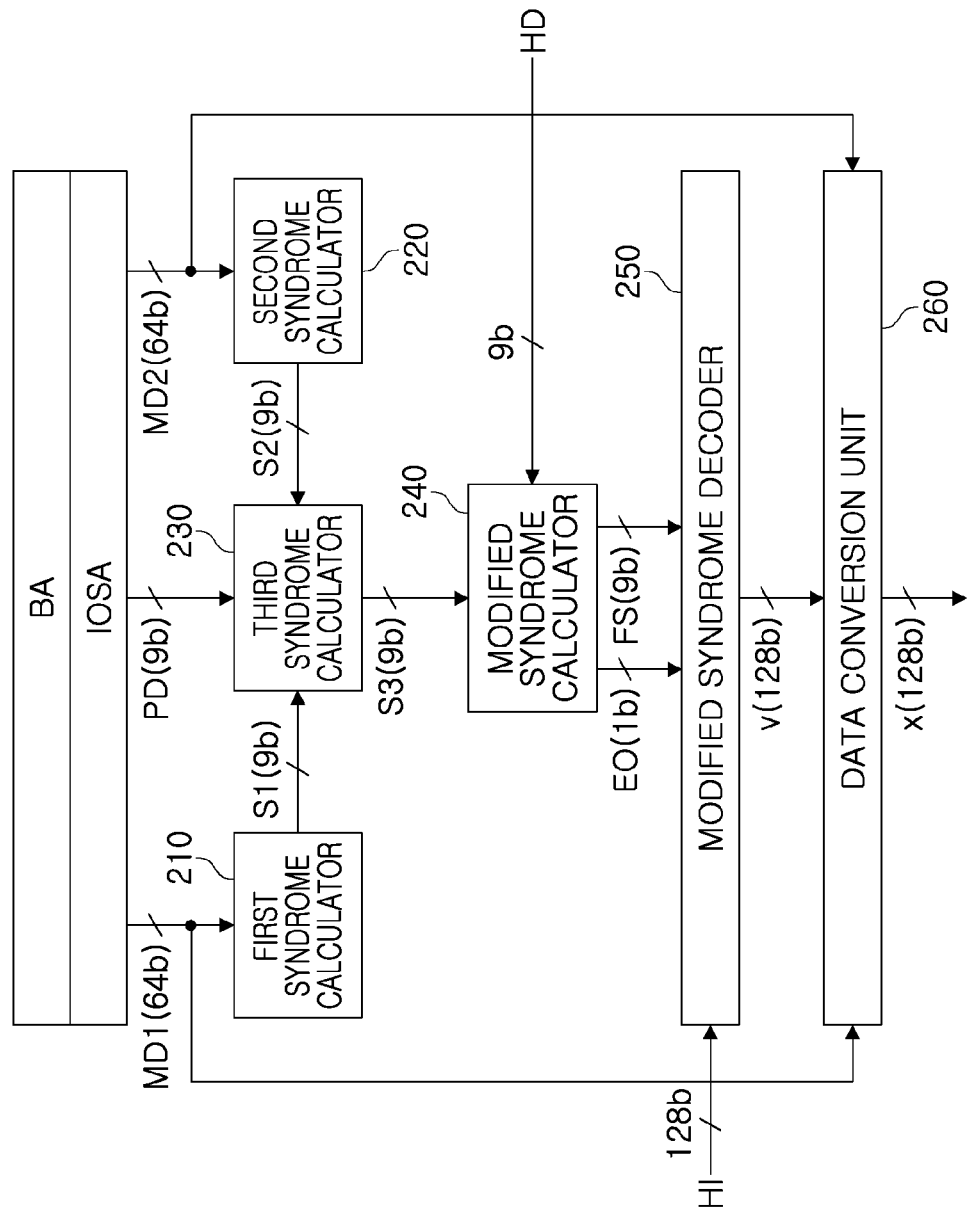
FIG. 10 is a view illustrating an ECC decoder according to an embodiment of the present inventive concept.

FIG. 10 is a diagram illustrating an ECC decoder according to an embodiment of the present inventive concept.

Referring to FIG. 10, the ECC decoder 200 may include first to third syndrome calculators 210 to 230, a modified syndrome calculator 240, a modified syndrome decoder 250, and a data conversion unit 260.

According to an embodiment, a codeword including 128-bit main data MD and 9-bit parity data PD may be output to the ECC decoder 200 from a bank array BA through an input/output sense amplifier IOSA. The ECC decoder 200 may receive a codeword including 128-bit main data MD and 9-bit parity data PD. The H-matrix may be a 9×(128+9) matrix.

The first syndrome calculator 210 may calculate a first syndrome S1 for at least a portion of the main data. For example, the first syndrome calculator 210 may receive 64-bit main data from among 128-bit main data and multiply the H-matrix by the 64-bit main data to calculate the first syndrome S1.

The second syndrome calculator 220 may calculate the second syndrome S2 for the remaining portion of the main data. For example, the second syndrome calculator 220 may receive the remaining 64-bit main data among the 128-bit main data and calculate the second syndrome S2 by multiplying the H-matrix by the 64-bit main data.

The third syndrome calculator 230 may receive the first syndrome S1 from the first syndrome calculator 210, receive the second syndrome S2 from the second syndrome calculator 220, and receive parity data PD from the bank array BA through the input/output sense amplifier IOSA. The third syndrome calculator 230 may perform an XOR operation on the first syndrome S1, the second syndrome S2, and the parity data PD to calculate a third syndrome S3.

The modified syndrome calculator 240 may receive the third syndrome S3 from the third syndrome calculator 230 and receive the column data HD of the erasure from the SRAM. The modified syndrome calculator 240 may determine a weight of the third syndrome S3.

The modified syndrome calculator 240 outputs the third syndrome as a final syndrome FS if the weight of the third syndrome S3 is an odd number, and outputs the modified syndrome MS the final syndrome FS if the weight of the third syndrome S3 is an even number.

Figure 11:
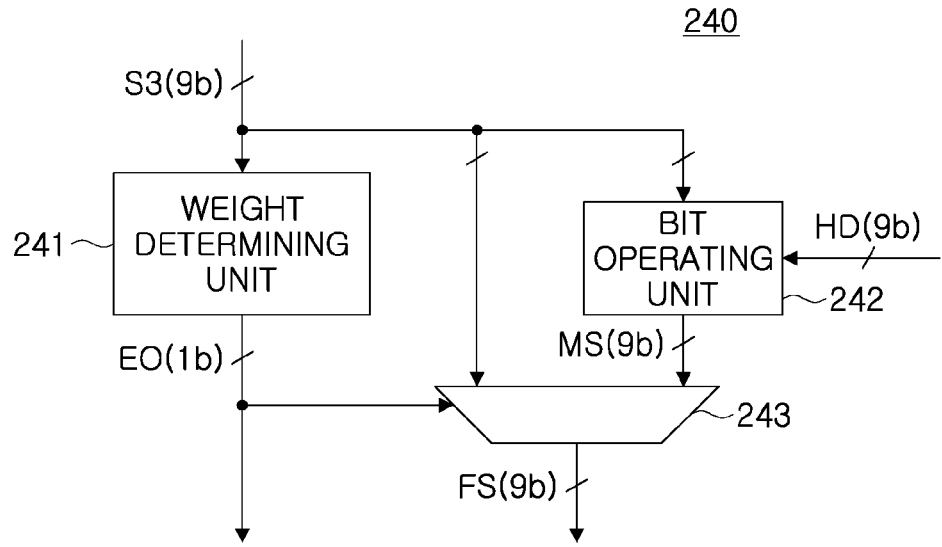
FIG. 11 is a view illustrating a modified syndrome calculator according to an embodiment of the present inventive concept.

FIG. 11 is a diagram illustrating a modified syndrome calculator according to an embodiment of the present inventive concept.

Referring to FIG. 11, the modified syndrome calculator 240 may include a weight determining unit 241, a bit operating unit 242, and a selector 243. Each of the modified syndrome calculator 240, the weight determining unit 241, the bit operating unit 242, and the selector 243 may be implemented by a circuit, for example including transistors, logic gates, and other components.

The weight determining unit 241 may receive the third syndrome S3 from the third syndrome calculator 230 and determine a weight EO of the third syndrome S3. The weight determining unit 241 outputs '0' to the selector 243 if the weight of the third syndrome S3 is an odd number, and outputs '1' to the selector 243 if the weight of the third syndrome S3 is an even number.

The bit operating unit 242 may receive the third syndrome S3 from the third syndrome calculator 230 and receive the column data HD of the erasure from the SRAM. The bit operating unit 242 may calculate the modified syndrome MS by performing a bitwise XOR operation on the third syndrome S3 and the column data HD of the erasure.

The selector 243 may receive the third syndrome S3 from the third syndrome calculator 230 and receive the modified syndrome MS from the bit operating unit 242. The selector 243 may output one of the third syndrome S3 and the modified syndrome MS in response to the weight EO of the third syndrome S3. For example, the selector 243 may output the third syndrome S3 as the final syndrome FS if the weight of the third syndrome S3 is an odd number, and output the modified syndrome MS as the final syndrome FS if the weight of the third syndrome S3 is an even number.

Referring back to FIG. 10, the modified syndrome decoder 250 may receive the column index HI of the erasure from the SRAM, and may receive the weight EO of the third syndrome S3 and the final syndrome FS from the modified syndrome calculator 240.

The modified syndrome decoder 250 may generate error vector v estimating a position of the erasure and a position of a random error in the codeword received from the bank array BA using the column index HI of the erasure, the weight EO of the third syndrome S3, and the final syndrome FS.

For example, if the weight EO of the third syndrome S3 is an even number, the modified syndrome decoder 250 may generate an error vector using the modified syndrome MS and the column index HI of the erasure. The error vector may be a vector estimating the position of the erasure and the position of the random error in the received codeword. If the weight EO of the third syndrome S3 is an odd number, the modified syndrome decoder 250 may generate an error vector using the third syndrome S3. The error vector may be a vector estimating the position of a random error in the received codeword.

Figure 12:
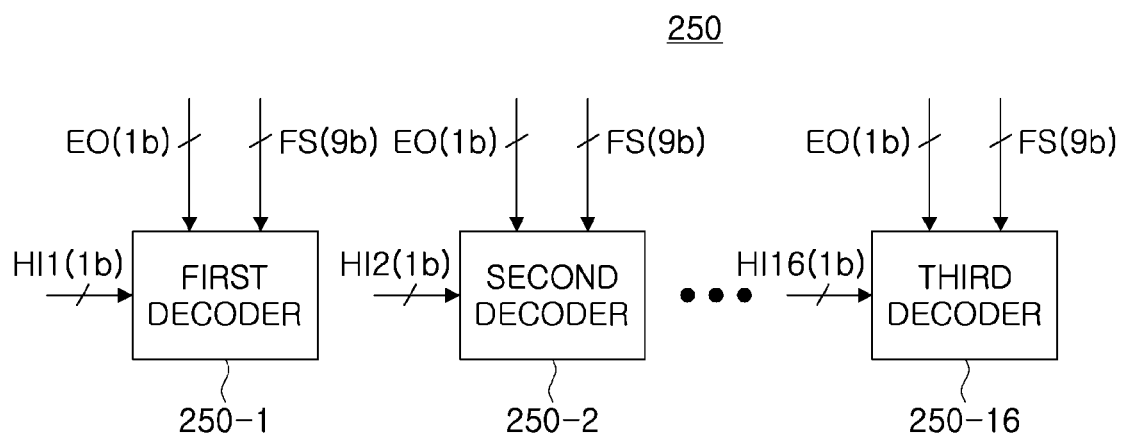
FIGS. 12 and 13 are views illustrating a modified syndrome decoder according to an embodiment of the present inventive concept.
Figure 13:
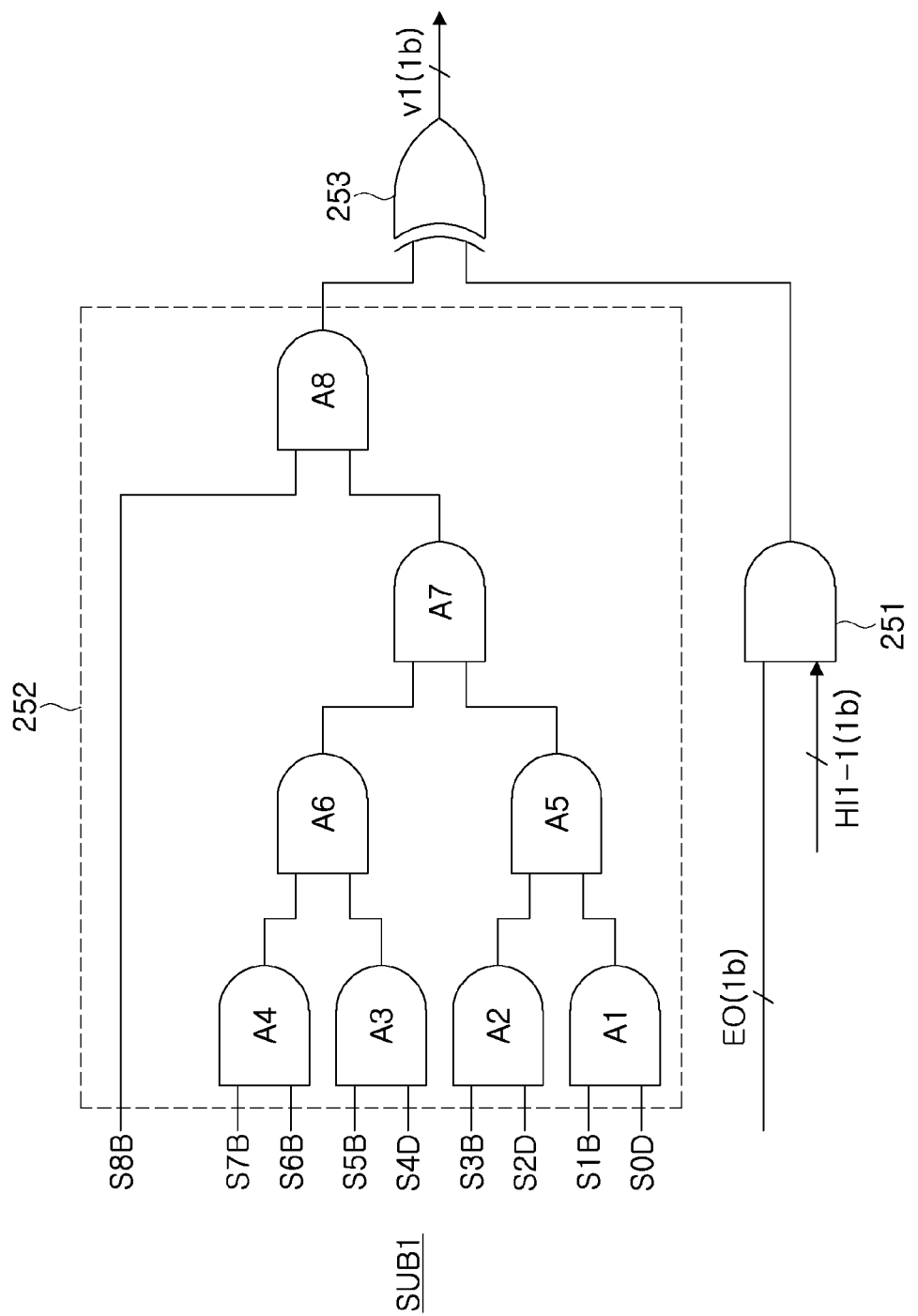

FIGS. 12 and 13 are diagrams illustrating a modified syndrome decoder according to an embodiment of the present inventive concept.

Referring to FIG. 12, the modified syndrome decoder 250 may include a plurality of decoders 250-1 to 250-16. For example, the column index HI of the erasure may consist of 128 bits, and the modified syndrome decoder 250 may include 16 decoders 250-1 to 250-16. Each of the plurality of decoders 250-1 to 250-16 may receive the column index HI of the erasure by 8 bits, and calculate the weight EO and the final syndrome FS of the third syndrome S3.

Since the column index HI of the erasure indicates the position of the column of the H-matrix corresponding to the position of the erasure in the codeword, each of the plurality of decoders 250-1 to 250-16 may estimate the position of the erasure in the received codeword based on the column index HI of the erasure. For example, each of the plurality of decoders 250-1 to 250-16 may compare the weight EO of the third syndrome S3 with the 8-bit column index HI of the erasure by 1 bit each time. If the weight EO of the third syndrome S3 is an even number and a particular bit of the column index HI of the erasure is '1', a bit position corresponding to the position in which the particular bit of the column index HI of the erasure is '1' in the received codeword may be estimated to be the position of the erasure, and thus, a corresponding decoder of the plurality of decoders 250-1 to 250-16 may output '1'.

In addition, each of the plurality of decoders 250-1 to 250-16 may compare the final syndrome FS with the components of each column of the H-matrix bitwise. If the components of the column of the H-matrix match the final syndrome FS (e.g., they are identical), the bit position corresponding to the position of the column of the H-matrix in the received codeword may be estimated to be a position of a random error, and thus, a plurality of decoders 250-1 to 250-16 may output data '1', respectively.

Accordingly, the plurality of decoders 250-1 to 250-16 may generate an error vector v estimating the position of the erasure and the position of the random error in the received codeword.

Each of the plurality of decoders 250-1 to 250-16 may include eight sub-decoders, and since each of the plurality of sub-decoders has a structure and function similar to each other, a first sub-decoder of the decoder 250-1 is described.

Referring to FIG. 13, the first sub decoder SUB may include a first logic circuit 251, a second logic circuit 252, and a third logic circuit 253.

The first logic circuit 251 may receive a first bit HI1 of the column index of the erasure and the weight EO of the third syndrome S3. The first logic circuit 251 may perform an AND operation on the first bit HI1 of the column index of the erasure and the weight EO of the third syndrome S3. The first logic circuit 251 may output '1' when the weight EO of the third syndrome S3 is an even number and the first bit of the column index HI of the erasure is '1'. In this manner, the position of the first bit in the received codeword may be estimated as the position of the erasure.

The second logic circuit 252 may perform bit flipping on the bit of the final syndrome FS corresponding to the component of '1' in the first column of the H-matrix. The bit flipping refers to reversely changing bit information, for example, changing '0' to '1' and '1' to '0'.

The second logic circuit 252 may include first to eighth logical AND gates A1-A8. Assuming that the component of the first column of the H-matrix is '101010000', the first AND gate A1 may receive the first bit of the final syndrome FS as it is and may receive a second bit of the final syndrome FS by inverting the second bit. The first AND gate A1 may perform an AND operation on the first bit of the final syndrome FS and the value obtained by inverting the second bit of the final syndrome FS.

The second AND gate A2 may receive a third bit of the final syndrome FS as it is and may receive a fourth input of the final syndrome by inverting the fourth bit. The second AND gate A2 may perform an AND operation on the third bit of the final syndrome FS and the value obtained by inverting the fourth bit of the final syndrome FS.

The third AND gate A3 may receive a fifth bit of the final syndrome FS as it is and may receive a sixth bit of the final syndrome FS by inverting the sixth bit. The third AND gate A3 may perform an AND operation on the fifth bit of the final syndrome FS and the value obtained by inverting the sixth bit of the final syndrome FS.

The fourth AND gate A4 may receive a seventh bit of the final syndrome FS by inverting the seventh bit and may receive an eighth bit of the final syndrome FS by inverting the eighth bit. The fourth AND gate AR may perform AND operation on the value obtained by inverting the seventh bit of the final syndrome FS and the value obtained by inverting the eighth bit of the final syndrome FS.

The fifth AND gate A5 may perform an AND operation on an output of the first AND gate A1 and an output of the second AND gate A2, the sixth AND gate A6 may perform an AND operation on an output of the third AND gate A3 and an output of the fourth AND gate A4, and the seventh AND gate A7 may perform an AND operation on an output of the fifth AND gate A5 and an output of the sixth AND gate A6.

The eighth AND gate A8 may perform an AND operation on an output of the seventh AND gate A7 and the value obtained by inverting the ninth bit of the final syndrome FS.

The second logic circuit 252 may compare the final syndrome FS with the components of the first column of the H-matrix bitwise, and if the final syndrome FS matches the components of the first column of the H-matrix, the second logic circuit 252 may output '1'. In this manner, it may be estimated that a bit position corresponding to the position of the column of the H-matrix in the received codeword is the position of a random error.

The third logic circuit 253 may perform an XOR operation on an output of the first logic circuit 251 and an output of the second logic circuit 252. Accordingly, the third logic circuit 253 may output '1' in the bit position corresponding to the position of the erasure or the position of the random error in the received codeword.

The second sub-decoder may output '1' when the weight EO of the third syndrome S3 is an even number and the second bit of the column index HI of the erasure is '1'. In addition, the second sub-decoder may compare the final syndrome FS with the components of the second column of the H-matrix bitwise, and output '1' when the final syndrome FS matches the components of the second column of the H-matrix. Accordingly, the second sub-decoder may output '1' in the bit position corresponding to the position of the erasure or the position of the random error in the received codeword.

In a manner similar to the above, each of the remaining sub-decoders may output '1' in a bit position corresponding to the position of the erasure or the position of the random error in the received codeword.

Referring back to FIG. 10, the data conversion unit 260 may correct an error in the main data MD1 and MD2 by performing a bitwise XOR operation on the 128-bit main data MD1 and MD2 and the error vector v.

Figure 14:
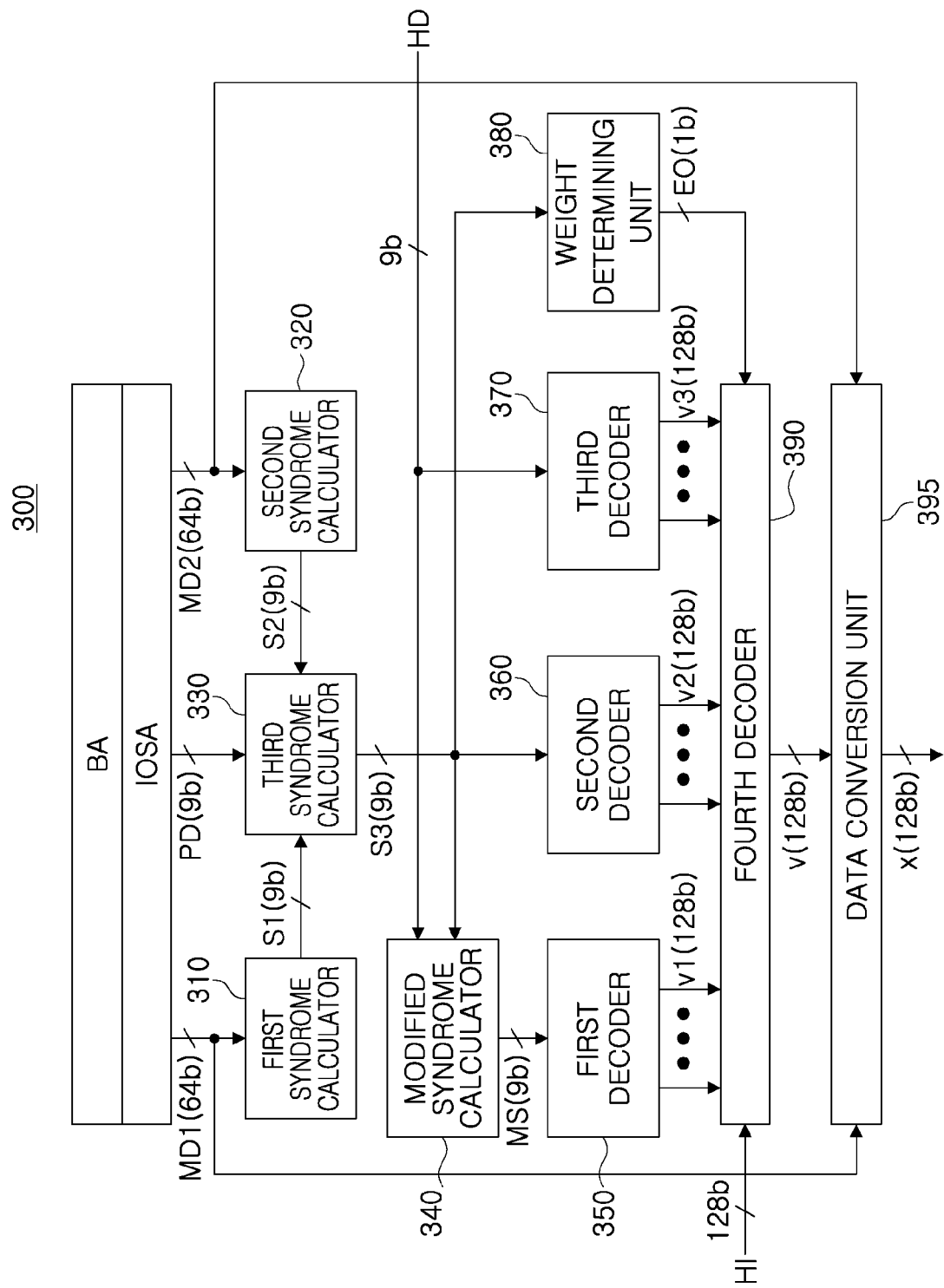
FIG. 14 is a view illustrating an ECC decoder according to an embodiment of the present inventive concept.

FIG. 14 is a diagram illustrating an ECC decoder according to an embodiment of the present inventive concept.

Referring to FIG. 14, the ECC decoder 300 may include first to third syndrome calculators 310 to 330, a modified syndrome calculator 340, first to third decoders 350 to 370, a weight determining unit 380, a fourth decoder 390, and a data conversion unit 260.

According to an embodiment, a codeword including 128-bit main data MD and 9-bit parity data PD may be output from a bank array BA to the ECC decoder 200 through the input/output sense amplifier IOSA. The ECC decoder 300 may receive a codeword including 128-bit main data MD and 9-bit parity data PD. An H-matrix may be a 9×(128+9) matrix.

The first syndrome calculator 310 may calculate a first syndrome S1 for at least a portion MD1 of the main data MD. For example, the first syndrome calculator 310 may receive 64-bit main data MD1 from among the 128-bit main data MD and multiply the H-matrix by the 64-bit main data MD1 to calculate the first syndrome S1.

The second syndrome calculator 320 may calculate a second syndrome S2 for the other portion MD2 of the main data MD. For example, the second syndrome calculator 320 may receive the remaining 64-bit main data MD2 from among the 128-bit main data MD and multiply the H-matrix by the 64-bit main data MD to calculate the second syndrome S2.

The third syndrome calculator 330 may receive the first syndrome S1 from the first syndrome calculator 310, receive the second syndrome S2 from the second syndrome calculator 320, and receive the parity data PD from the bank array BA through the input/output sense amplifier IOSA. The third syndrome calculator 330 may calculate the third syndrome S3 by performing an XOR operation on the first syndrome S1, the second syndrome S2, and the parity data PD.

The modified syndrome calculator 340 may receive the third syndrome S3 from the third syndrome calculator 330 and receive the column data HD of the erasure from the SRAM.

Figure 15:
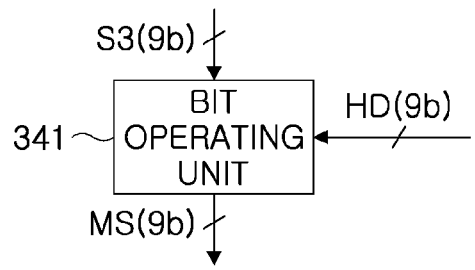
FIG. 15 is a view illustrating a modified syndrome calculator according to an embodiment of the present inventive concept.

FIG. 15 is a diagram illustrating a modified syndrome calculator according to an embodiment of the present inventive concept.

Referring to FIG. 15, the modified syndrome calculator 340 may include a bit operating unit 341.

The bit operating unit 341 may receive the third syndrome S from the third syndrome calculator 330 and may receive the column data HD of the erasure from the SRAM. The bit operating unit 341 may perform a bitwise XOR operation on the third syndrome S3 and the column data HD of the erasure to calculate a modified syndrome MS.

Referring back to FIG. 14, according to embodiments, the first to fourth decoders 350 to 370 and 390 may generate an error vector v by estimating a position of a random error in the received codeword using the weight EO of the third syndrome, the third syndrome S3, and the modified syndrome MS. For example, when the weight EO of the third syndrome is an odd number, the third syndrome matches the components of the H-matrix, and the modified syndrome MS matches the components of the H-matrix, the first to fourth decoders 350 to 370 and 390 may estimate a bit position corresponding to the position of the column of the H-matrix in the received codeword as a position of the random error. The first to fourth decoders 350 to 370 and 390 may generate the error vector v by estimating the position of the random error in the received codeword.

According to embodiments, the first to fourth decoders 350 to 370 and 390 may estimate the position of the erasure in the received codeword using the column data HD of the erasure and generate an error vector v by estimating a position of a random error in the received codeword using the modified syndrome MS. For example, when the weight EO of the third syndrome is an even number and the column data HD of the erasure matches the components of the column of the H-matrix, a bit position corresponding to the position of the column of the H-matrix in the received codeword may be estimated to be a position of the erasure. In addition, when the weight EO of the third syndrome is an even number and the modified syndrome MS matches the components of the column of the H-matrix, a bit position corresponding to the position of the column of the H-matrix in the received code may be estimated to be a position of the random error. The first to fourth decoders 350 to 370 and 390 may generate an error vector v by estimating a position of the erasure and a position of a random error in the received codeword.

The data conversion unit 395, also described as a data conversion circuit, may perform a bitwise XOR operation between the 128-bit main data MD1 and MD2 and the error vector v to correct errors in the main data MD1 and MD2.

The operations of the first to fourth decoders 350 to 370 and 390 are described in detail as follows.

The first decoder 350 may receive the modified syndrome MS from the modified syndrome calculator 340. The first decoder 350 may generate a first error vector v1 estimating a position of a random error in the received codeword using the modified syndrome MS. The first decoder 350 may include a plurality of sub-decoders, and each of the plurality of sub-decoders may compare the modified syndrome MS with the components of each column of the H-matrix bitwise. If the modified syndrome MS matches the components of a particular column of the H-matrix, a bit position corresponding to a position of the corresponding column of the H-matrix in the received codeword may be estimated to be a position of the random error. Accordingly, each of the plurality of sub-decoders may output data '1' when the modified syndrome MS matches the components of the corresponding column of the H-matrix. The first decoder 350 may include 128 sub-decoders, and since each of the plurality of sub-decoders has similar structures and functions, a first sub-decoder is described with reference to FIG. 16.

Figure 16:
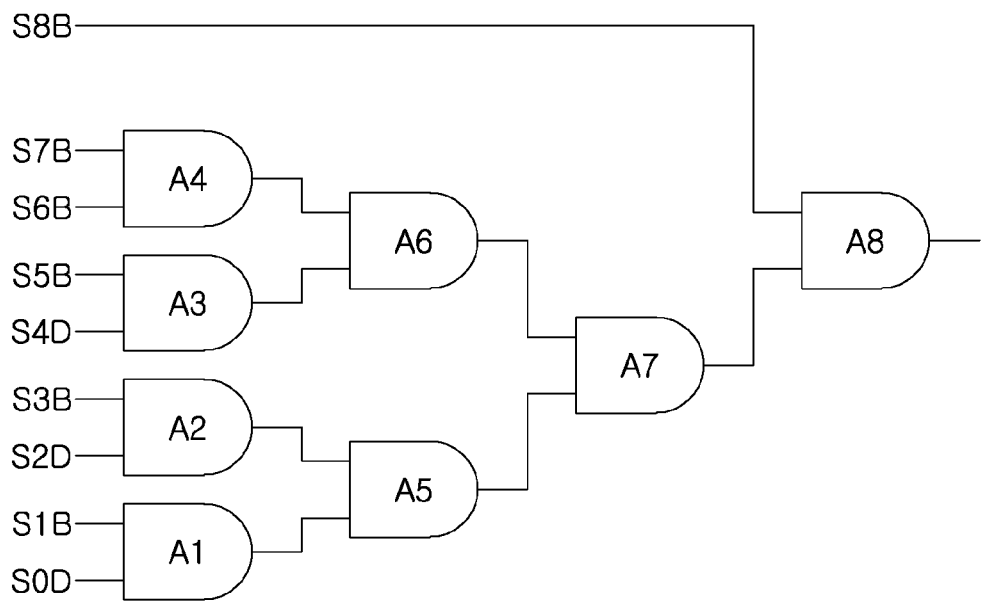
FIG. 16 is a view illustrating a first sub-decoder according to an embodiment of the present inventive concept.

FIG. 16 is a diagram illustrating a first sub-decoder according to an embodiment of the present inventive concept.

Referring to FIG. 16, the first sub decoder SUB1 may perform bit flipping on the bit of the modified syndrome MS corresponding to the component of '1' in the first column of the H-matrix. The bit flipping refers to reversely changing bit information, for example, changing '0' to '1' and '1' to '0'.

The first sub-decoder SUB1 may include first to eighth logical AND gates A1-A8. Assuming that the component of the first column of the H-matrix is '101010000', the first AND gate A1 may receive the first bit of the modified syndrome MS as it is and may receive a second bit of the final syndrome FS by inverting the second bit. The first AND gate A1 may perform an AND operation on the first bit of the modified syndrome MS and the value obtained by inverting the second bit of the modified syndrome MS.

The second AND gate A2 may receive a third bit of the modified syndrome MS as it is and may receive a fourth input of the final syndrome by inverting the fourth bit. The second AND gate A2 may perform an AND operation on the third bit of the modified syndrome MS and the value obtained by inverting the fourth bit of the modified syndrome MS.

The third AND gate A3 may receive a fifth bit of the modified syndrome MS as it is and may receive a sixth bit of the modified syndrome MS by inverting the sixth bit. The third AND gate A3 may perform an AND operation on the fifth bit of the modified syndrome MS and the value obtained by inverting the sixth bit of the modified syndrome MS.

The fourth AND gate A4 may receive a seventh bit of the modified syndrome MS by inverting the seventh bit and may receive an eighth bit of the modified syndrome MS by inverting the eighth bit. The fourth AND gate A4 may perform an AND operation on the value obtained by inverting the seventh bit of the modified syndrome MS and the value obtained by inverting the eighth bit of the modified syndrome MS.

The fifth AND gate A5 may perform an AND operation on an output of the first AND gate A1 and an output of the second AND gate A2, the sixth AND gate A6 may perform an AND operation on an output of the third AND gate A3 and an output of the fourth AND gate A4, and the seventh AND gate A7 may perform an AND operation on an output of the fifth AND gate A5 and an output of the sixth AND gate A6.

The eighth AND gate A8 may perform an AND operation on an output of the seventh AND gate A7 and the value obtained by inverting the ninth bit of the modified syndrome MS.

The first sub-decoder SUB1 may compare the modified syndrome MS with the components of the first column of the H-matrix bitwise, and if the modified syndrome MS matches the components of the first column of the H-matrix, the second logic circuit 252 may output '1'. In this manner, a first bit position in the received codeword may be estimated to be a position of a random error.

The second sub-decoder may compare the modified syndrome MS with the components of the second column of the H-matrix bitwise, and output '1' when the modified syndrome MS matches the components of the second column of the H-matrix. In this manner, a second bit position in the received codeword may be estimated to be a position of a random error.

In a manner similar to the above, each of the remaining sub-decoders may output data '1' when the modified syndrome MS matches the components of the column of the H-matrix.

Referring back to FIG. 14, the second decoder 360 may receive the third syndrome S3 from the third syndrome calculator 330. The second decoder 360 may generate a second error vector v2 estimating the position of a random error in the codeword received from the bank array BA using the third syndrome S3. The second decoder 360 may include a plurality of sub-decoders, and each of the plurality of sub-decoders may compare the third syndrome S3 with the components of each column of the H-matrix bitwise. If the third syndrome S3 matches the components of a particular column of the H-matrix, a bit position corresponding to the position of the corresponding column of the H-matrix in the received codeword may be estimated to be a position of the random error, and thus, a sub-decoder in which this occurs may output data '1'.

Since each of the plurality of sub-decoders included in the second decoder has a structure and function similar to those of the first sub-decoder of FIG. 16, a redundant description thereof is omitted.

The third decoder 370 may receive the column data HD of the erasure from the SRAM. The third decoder 370 may generate a third error vector v3 estimating the position of the erasure in the codeword received from the bank array BA using the column data HD of the erasure. The third decoder 370 may include a plurality of sub-decoders, and each of the plurality of sub-decoders may compare column data HD of the erasure with the components of each column of the H-matrix. If the column data HD of the erasure matches the components of the column of the H-matrix, a bit position corresponding to the position of the column of the H-matrix in the received codeword may be estimated to be a position of the erasure, and thus, a sub-decoder in which this occurs may output data '1'.

Since each of the plurality of sub-decoders included in the third decoder has a structure and function similar to those of the first sub-decoder of FIG. 16, a redundant description thereof is omitted.

The weight determining unit 380 may determine a weight of the third syndrome S. The weight determining unit 380 may output a weight EO of the third syndrome S as '1' if the weight of the third syndrome S is an odd number, and may output the weight EO of the third syndrome S as '0' if the weight of the third syndrome S is an even number.

The fourth decoder 390 may receive a first error vector v1 from the first decoder 350, may receive a second error vector v2 from the second decoder 360, may receive a third error vector v3 from the third decoder 370, and may receive the weight EO of the third syndrome from the weight determining unit 380. The fourth decoder 390 may generate a final error vector v using the first error vector v1, the second error vector v2, the third error vector v3, and the weight EO of the third syndrome.

Figure 17:
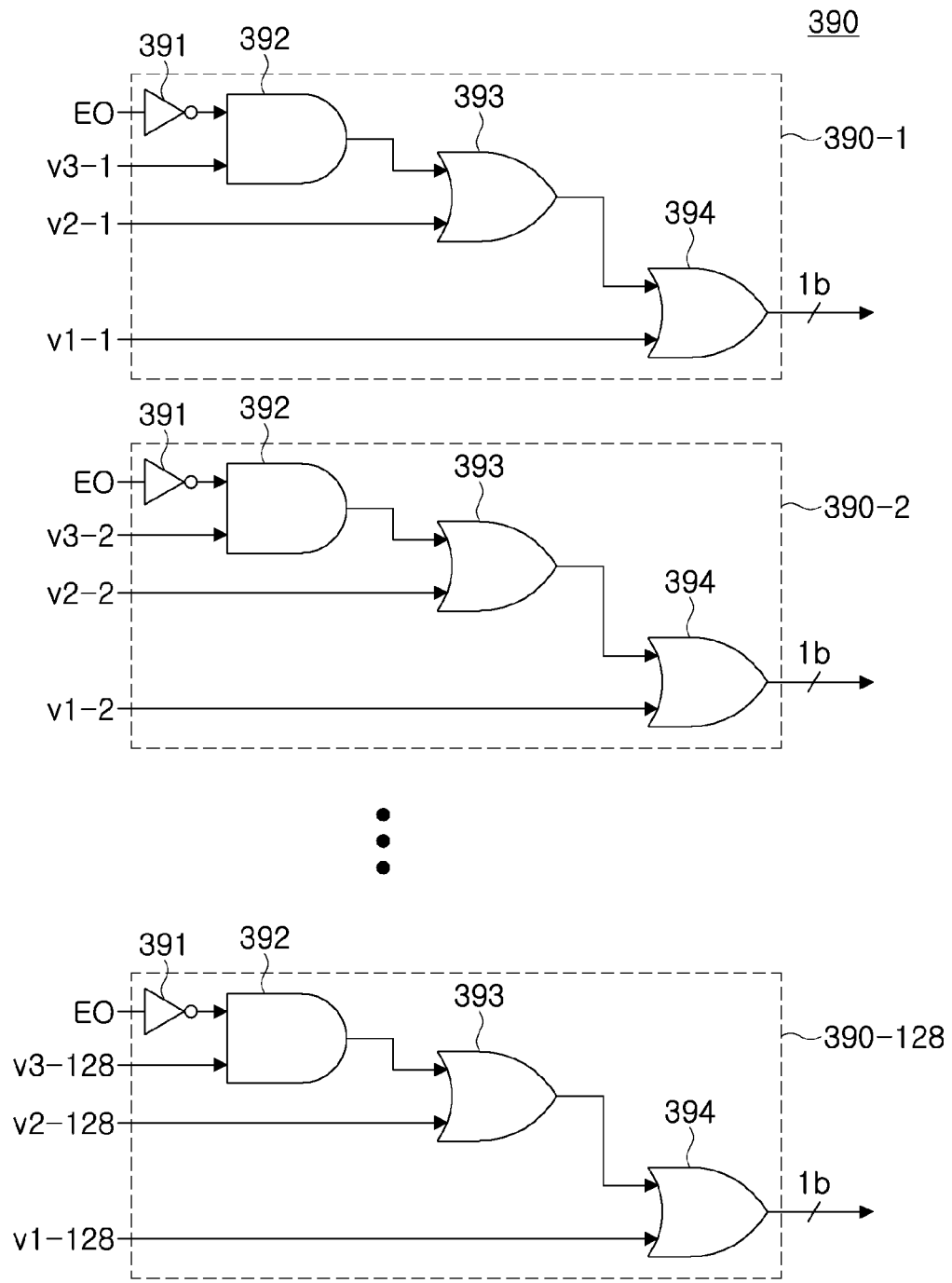
FIG. 17 is a diagram illustrating a fourth decoder according to an embodiment of the present inventive concept.

FIG. 17 is a diagram illustrating a fourth decoder according to an embodiment of the present inventive concept.

Referring to FIG. 17, the fourth decoder 390 may include a plurality of sub-decoders 390-1 to 390-128. As an example, main data of the received codeword may have 128 bits, and the fourth decoder 390 may include 128 sub-decoders 390-1 to 390-128. Each of the sub-decoders 390-1 to 390-128 may include an inverter 391, an AND gate 392, a first OR gate 393, and a second OR gate 394.

The operation of the first sub-decoder 390-1 is described as follows.

The inverter 391 may output a value obtained by inverting the output EO of the weight determining unit 380. The AND gate 392 may receive an output from the inverter 391 and a value corresponding to a first bit of an output v3 of the third decoder 370, and perform an AND operation on the output of the inverter 391 and the value corresponding to the first bit in the output v3 of the decoder 370. If the weight of the third syndrome S3 is an even number and the column data HD of the erasure matches a first column of the H-matrix, an output of the AND gate 392 may be '1'. Accordingly, the position of the erasure may be estimated to be a first bit in the received codeword.

The first OR gate 393 may receive an output of the AND gate 392 and a value corresponding to a first bit of an output v2 of the second decoder 360, and perform an AND operation on the output of the AND gate 392 and the value corresponding to the first bit of the output v2 of the second decoder 360. If the third syndrome S3 matches a first column of the H-matrix but it is not an erasure, an output of the first OR gate 393 may be '1'. Accordingly, the position of a random error may be estimated to be a first bit in the received codeword.

Alternatively, if the weight of the third syndrome S3 is an even number, the column data HD of the erasure matches the first column of the H-matrix, but it is not a random error, the output of the first OR gate 393 may be '1'. Accordingly, the position of the erasure may be estimated to be the first bit in the received codeword.

The second OR gate 394 may receive an output of the first OR gate 393 and a value corresponding to a first bit in an output v1 of the first decoder 350, and perform an OR operation on the output of the first OR gate 393 and the value corresponding to the first bit in the output v1 of the first decoder 350. If the modified syndrome MS matches the first column of the H-matrix, a weight of the third syndrome S3 is an even number, the column data HD of the erasure matches the first column of the H-matrix, but it is not a random error, an output of the second OR gate 394 may be '1'. Accordingly, the position of the erasure may be estimated to be the first bit in the received codeword. Alternatively, if the third syndrome S3 matches the first column of the H-matrix but it is not an erasure, the output of the second OR gate 394 may be '1'. Accordingly, the position of the random error may be estimated to the first bit in the received codeword.

In a manner similar to the above, each of the remaining sub-decoders may output '1' in a bit position corresponding to the position of the erasure or the position of the random error in the received codeword.

According to an embodiment of the present inventive concept, since a 2-bit error may be corrected by SEC-DED using erasure information, an error correction method that is easy to implement at low cost may be provided.

While example embodiments have been shown and described above, it will be apparent to those skilled in the art that modifications and variations could be made without departing from the scope of the present invention as defined by the appended claims.

What is claimed is:

1. An operating method of a memory device, the operating method comprising:
    storing, in a memory region, position information regarding a codeword including an erasure, and erasure information including position information regarding a position of the erasure in the codeword;
    loading the position information regarding the codeword to a row decoder and a column decoder during power up;
    determining whether a read address corresponding to a read instruction is identical to the position information regarding the codeword including the erasure, in response to the read instruction from a host;
    transmitting the position information regarding the position of the erasure in the codeword to an error correction code (ECC) decoder, when the read address is identical to the position information regarding the codeword including the erasure; and
    correcting, by the ECC decoder, an error in a codeword received from a memory cell array using the position information regarding the position of the erasure in the codeword,
    wherein the correcting of the error by the ECC decoder includes:
    calculating a syndrome using the received codeword and an H-matrix;
    calculating a modified syndrome using the syndrome and the position information regarding the position of the erasure in the codeword;
    determining a weight of the syndrome; and
    correcting the error using the position information regarding the position of the erasure in the codeword and the modified syndrome when the weight of the syndrome is an even number.

2. The operating method of claim 1, wherein the error includes a 1-bit erasure and a 1-bit random error.

3. The operating method of claim 1, wherein the memory region is at least one of an anti-fuse array and content-addressable memory (CAM).

4. The operating method of claim 1, wherein a 1-bit erasure is corrected in the received codeword using the position information regarding the position of the erasure in the codeword, and a 1-bit random error is corrected in the received codeword using the modified syndrome.

5. The operating method of claim 1, wherein a 1-bit random error is corrected in the received codeword using the syndrome, when the weight of the syndrome is an odd number.

6. An operating method of a memory device, the operating method comprising:
    receiving a codeword from a memory cell array and calculating a syndrome of the received codeword;
    calculating a modified syndrome using the syndrome and column data of an erasure;
    determining a weight of the syndrome; and
    correcting an error of the received codeword using the modified syndrome and a column index of the erasure when the weight of the syndrome is an even number, and transmitting a result of the correction to a host, wherein the column data of the erasure is a component of an H-matrix corresponding to a position of the erasure in the received codeword, and the column index of the erasure indicates a bit position corresponding to the erasure in the received codeword.

7. The operating method of claim 6, wherein, in the calculating of the modified syndrome, a bitwise XOR operation is performed on the syndrome and the column data of the erasure to calculate the modified syndrome.

8. The operating method of claim 6, wherein
the correcting of the error includes:
generating an error vector by estimating the position of the erasure in the received codeword using the column index of the erasure and estimating a position of a random error in the received codeword using the modified syndrome; and
correcting the error of the received codeword using the received codeword and the error vector.

9. The operating method of claim 8, wherein
the generating of the error vector includes:
estimating, as the position of the erasure, a bit position corresponding to a position in which a particular bit of the column index of the erasure is '1' in the received codeword;
comparing the modified syndrome with a component of each column of the H-matrix bitwise; and
estimating, as the position of the random error, a bit position corresponding to a position of a corresponding column of the H-matrix in the received codeword, when the modified syndrome and the component of the corresponding column of the H-matrix are identical to each other.

10. The operating method of claim 6, wherein,
in the correcting of the error,
the error of the received codeword is corrected using the syndrome, when the weight of the syndrome is an odd number.

11. The operating method of claim 10, wherein
the correcting of the error includes:
generating an error vector by estimating a position of a random error in the received codeword using the syndrome; and
correcting the error of the received codeword using the received codeword and the error vector.

12. The operating method of claim 11, wherein
the generating of the error vector includes:
comparing the syndrome with a component of each column of the H-matrix bitwise; and
estimating, as the position of the random error, a bit position corresponding to a position of the corresponding column of the H-matrix in the received codeword, when the syndrome is identical to the component of the corresponding column of the H-matrix.

13. An operating method of a memory device, the operating method comprising:
receiving a codeword from a memory cell array and calculating a syndrome of the received codeword;
calculating a modified syndrome using the syndrome and column data of an erasure;
determining a weight of the syndrome; and
correcting an error of the received codeword using the syndrome, the modified syndrome, and the weight of the syndrome, and transmitting a result of the correction to a host,
wherein the column data of the erasure is a component of an H-matrix corresponding to a position of the erasure in the received codeword, and
wherein the error is a 2-bit error.

14. The operating method of claim 13, wherein, in the calculating of the modified syndrome, a bitwise XOR operation is performed on the syndrome and the column data of the erasure to calculate the modified syndrome.

15. The operating method of claim 13, wherein
the correcting of the error includes:
generating an error vector by estimating a position of a random error in the received codeword using the weight of the syndrome, the syndrome, and the modified syndrome; and
correcting the error of the received codeword using the received codeword and the error vector.

16. The operating method of claim 15, wherein,
in the generating of the error vector,
a bit position corresponding to a position of a column of the component of the H-matrix in the received codeword is estimated as the position of the random error, when the weight of the syndrome is an odd number, the syndrome and the component of the H-matrix are identical to each other, and the modified syndrome and the component of the H-matrix are identical to each other.

17. The operating method of claim 13, wherein
the correcting of the error includes:
generating an error vector by estimating the position of the erasure in the received codeword using the column data of the erasure and estimating a position of a random error in the received codeword using the modified syndrome; and
correcting the error of the received codeword using the received codeword and the error vector.

18. The operating method of claim 17, wherein,
in the generating of the error vector,
a bit position corresponding to a position of a corresponding column of the H-matrix in the received codeword is estimated as the position of the erasure when the column data of the erasure and the component of the column of the H-matrix are identical to each other, and
a bit position corresponding to the position of the corresponding column of the H-matrix in the received codeword is estimated as the position of the random error, when the modified syndrome and the component of the column of the H-matrix are identical to each other.

19. The operating method of claim 18, wherein the weight of the syndrome is an even number.

* * * * *